(12) United States Patent
Gottshall et al.

(10) Patent No.: US 7,681,778 B2
(45) Date of Patent: Mar. 23, 2010

(54) ELECTRONIC ASSEMBLY REMANUFACTURING SYSTEM AND METHOD

(75) Inventors: Paul C Gottshall, Peoria, IL (US); Ernesto Nicanor Santillan Guerrero, Nuevo Laredo (MX)

(73) Assignee: Caterpillar Inc., Peoria, IL (US)

( * ) Notice: Subject to any disclaimer, the term of this patent is extended or adjusted under 35 U.S.C. 154(b) by 56 days.

(21) Appl. No.: 11/943,219

(22) Filed: Nov. 20, 2007

(65) Prior Publication Data
US 2009/0127321 A1    May 21, 2009

(51) Int. Cl.
*B23K 1/018* (2006.01)
*B23K 31/02* (2006.01)

(52) U.S. Cl. .................. 228/103; 228/119; 228/191; 228/264

(58) Field of Classification Search ........................ None
See application file for complete search history.

(56) References Cited

U.S. PATENT DOCUMENTS 3,629,543 A * 12/1971 Mayhew et al. ............ 219/85.1

(Continued)

FOREIGN PATENT DOCUMENTS

DE    3232368 A1    3/1984

*Primary Examiner*—Kiley Stoner
(74) *Attorney, Agent, or Firm*—Leydig, Voit & Mayer Ltd (57) ABSTRACT

A method for remanufacturing an electronic assembly includes removing a first portion of an assembly housing to expose an underside of an enclosed circuit assembly. One or more solder joints on the underside of the circuit assembly are associated with at least one component that is also affixed to a portion of the housing. The opened electronic assembly is lowered onto a desoldering fixture having a plurality of solder pots configured to encompass, and thus desolder, the solder joints associated with the component that is affixed to a portion of the housing. Once the affected solder joints are melted, the remaining portion of the housing and the component affixed thereto may be lifted away, exposing the top surface of the circuit assembly for analysis, repair, and or adjustment.

11 Claims, 7 Drawing Sheets

U.S. PATENT DOCUMENTS

| | | | |
|---|---|---|---|
| 3,815,806 A | 6/1974 | Paxton | |
| 4,101,066 A | 7/1978 | Corsaro | |
| 4,162,034 A * | 7/1979 | Pavlas | 228/37 |
| 4,412,641 A | 11/1983 | Fuchs et al. | |
| 4,456,163 A * | 6/1984 | Zach | 228/56.1 |
| 4,506,820 A | 3/1985 | Brucker | |
| 4,659,002 A * | 4/1987 | Wallgren et al. | 228/8 |
| 4,769,083 A | 9/1988 | Tiritilli | |
| 4,779,790 A * | 10/1988 | Wallgren et al. | 228/180.1 |
| 4,979,662 A * | 12/1990 | Kim | 228/56.1 |
| 5,024,366 A * | 6/1991 | Kim | 228/56.1 |
| 5,072,874 A | 12/1991 | Bertram et al. | |
| 5,176,312 A * | 1/1993 | Lowenthal | 228/180.1 |
| 5,340,013 A * | 8/1994 | Poole et al. | 228/119 |
| 5,402,563 A | 4/1995 | Satoh et al. | |
| 5,617,990 A * | 4/1997 | Thompson, Sr. | 228/180.1 |
| 5,847,938 A * | 12/1998 | Gammon | 361/816 |
| 6,142,357 A * | 11/2000 | Howell | 228/39 |
| 6,256,478 B1 | 7/2001 | Allen et al. | |
| 6,257,478 B1 | 7/2001 | Straub | |
| 6,305,596 B1 * | 10/2001 | Lin et al. | 228/125 |
| 6,343,732 B1 * | 2/2002 | Graves et al. | 228/39 |
| 6,750,845 B2 * | 6/2004 | Hopper | 345/156 |
| 7,243,418 B2 * | 7/2007 | Murillo et al. | 29/762 |
| 2004/0253849 A1 * | 12/2004 | Kuribayashi et al. | 439/76.1 |
| 2005/0278925 A1 * | 12/2005 | Murillo et al. | 29/426.4 |
| 2006/0259788 A1 * | 11/2006 | Elbert et al. | 713/194 |
| 2007/0181640 A1 * | 8/2007 | Chen et al. | 228/101 |

\* cited by examiner

ELECTRONIC ASSEMBLY REMANUFACTURING SYSTEM AND METHOD

TECHNICAL FIELD

This patent disclosure relates generally to the remanufacture of electronic circuitry and, more particularly, to a system and method for remanufacturing electronic assemblies having one or more components thereof affixed to a separate housing.

BACKGROUND

With the advent of integrated electronics, electrical circuits have largely eliminated mechanical and electromechanical features in many applications, reducing the maintenance and adjustment chores associated with such applications. However, these electrical circuits as well as the mechanical aspects of the circuit housing, attachment points, and so on, may still occasionally require maintenance, adjustment, or even replacement. For example, power circuits may be exposed to excess heat and may be degraded. Vibration and other mechanical forces may affect the circuits and/or their housings or their connections to other circuit elements. However, due to the relative permanence of integrated circuit assemblies, these assemblies are not often configured for easy disassembly.

Compounding this problem, integrated circuits and other electrical assemblies are often connected to other circuitry via metallic solder because of its strength as an adhesive as well its relatively low impedance to the flow of electrical current. Solder enters a liquid state at a much lower temperature than many other metals, allowing ease of application, and remains conductive through repeated thermal cycling.

With the advent of the PCB (printed circuit board), the use of solder became widespread as a means of connecting components to PCB's. A PCB typically comprises a fiber or fiberglass board covered with metallic circuit traces, having components attached to the board in prescribed locations to contact the traces. Typically, such components have one or more "pins" or leads attached to the component that extend, parallel to one another, in one direction. During assembly, these leads are inserted through holes in the PCB (and in the overlying metallic traces) and are soldered to the traces. Often, the traces are shaped into "pads" or contacts at the points of insertion to ensure better attachment and conductivity between the component pins and the traces. PCBs made in this way tend to be cost effective, robust and reliable.

As noted above, however, electronic assemblies sometimes require disassembly, and such disassembly may require removal of one or more components from the board. It is often advantageous to affix certain assemblies to a housing or other nearby structure for purposes of heat transfer, mechanical support, and so on. However, by joining the board and housing in a semi-permanent manner, this practice can render one side of the board inaccessible, requiring desoldering of components to allow the remainder of the board to be accessed for inspection and repair.

Most solders melt at temperatures that are high enough to damage the housings and internal circuitry of many electrical components. In addition, mechanical stress and strain imposed during insertion and removal of components may weaken or damage components. Ideally, circuit components should be desoldered without damaging the components in question to the extent they are salvageable, and without causing damage to any surrounding components through the application of excess heat or mechanical strain.

Thus, desoldering and disassembly must be executed with care. At the same time, for large scale remanufacturing operations, efficiency is important, and removing and replacing multipin devices from PCBs by hand is still a slow and tedious process. Often, it is performed using a soldering iron and braided wick, or with a vacuum soldering iron to melt and remove solder. However, these methods require skill and care to prevent damage to the PCB, and the complexity and failure rate of these techniques essentially preclude efficient large-scale use.

Although a complete solution to this problem has never been found, certain attempts have been made over the years. For example, U.S. Pat. No. 4,506,820 to John Brucker describes a limited system for desoldering multipin components from printed circuit boards. According to the system of the '820 patent, a large shallow solder pot, in combination with a flexible mask, is used to apply molten solder to a selected area of a printed circuit board so as to desolder a selected device. Essentially, the '820 mask is applied to all surfaces of the board for which desoldering is not desired. In this manner, the components at the masked locations will in principle remain soldered when the entire assembly is exposed to the solder bath in the large shallow solder pot, and any unmasked components will be desoldered. However, in addition to the need to supply a pool of molten solder as large as the entire PCB, the '820 method also requires the design, creation, application, and removal of masks, with all attendant costs and complications. In addition, regardless of whether the '820 masks function properly during a given use, they do not appear to provide a robust and cost-effective solution for repetitive desoldering tasks.

SUMMARY

The disclosure describes, in one aspect, a method for remanufacturing an electronic assembly. The assembly includes a housing having therein a circuit assembly. The circuit assembly includes a number of components, at least one of which is attached to the housing. The housing is opened to expose a portion of the circuit assembly, the exposed portion of the circuit assembly having thereon a number of solder joints. One or more of the solder joints is associated with a component that is also affixed to a portion of the housing, making analysis and repair of the circuit assembly difficult. The exposed portion of the circuit assembly is lowered onto a desoldering fixture comprising a solder pot assembly including a plurality of solder pots configured to encompass the solder joints associated with the component affixed to the housing. After lowering the assembly onto the desoldering fixture, the housing and any attached components are lifted away, exposing the remainder of the circuit assembly for analysis, repair, and/or adjustment.

DETAILED DESCRIPTION

This disclosure relates primarily to a system for remanufacturing circuit board assemblies and other electrical assemblies that require selective removal of one or more components from the assembly, e.g., for access to a portion of the assembly for repair or analysis. In general terms, the remanufacturing process with respect to a circuit assembly entails disassembly and testing of the assembly and/or portions thereof to identify remedial actions to be taken. The tested assembly is then reconditioned by adjustment or replacement of one or more parts or components, after which the part is reassembled and tested.

Typically, electronic assemblies such as ECUs that are intended for use in industrial or other demanding environments comprise an active portion, e.g., a printed circuit board, as well as a housing that protects the active portion from the ambient environment. Thus, this housing is typically removed to allow access to the active portion of the assembly for analysis, inspection, repair, and so on. However, in some cases, certain components of the active portion of the assembly may be affixed to a portion of the housing, so that the housing cannot be readily removed. For example, it is often advantageous to affix transistors, voltage regulators, and other power electronic components to the housing for purposes of heat transfer, mechanical support, and so on. Typically, a strong heat-conductive epoxy or other structural adhesive is used to attach the power electronic component to the housing. As such, it is difficult to mechanically separate the power electronic component from the housing to provide access to the board as a whole. In an illustrated embodiment, such components remain affixed to the housing and are instead desoldered from the board to allow access to the remainder of the board.

Figure 6:
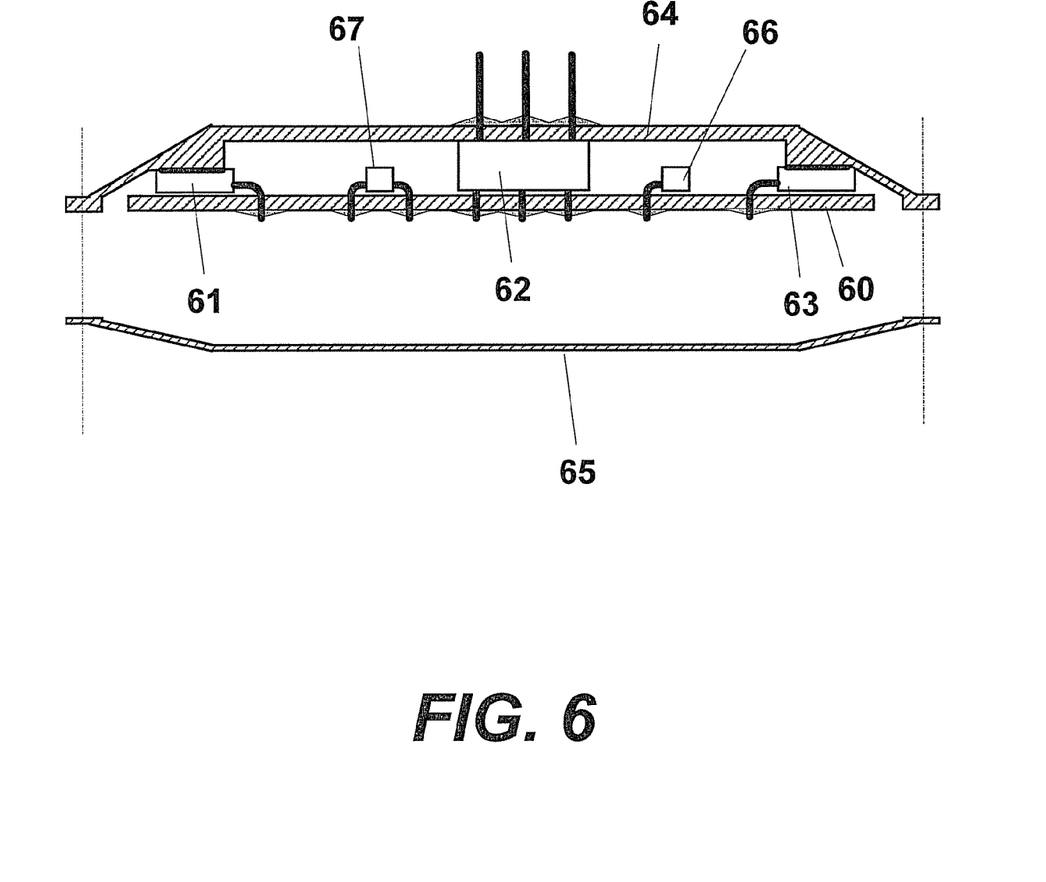
FIG. 6 is a cross-sectional side view of an electronic assembly usable in conjunction with the remanufacturing method in accordance with the disclosure.

An example of such as arrangement is shown in the cross-sectional side view of FIG. 6. A number of components 61, 62, 63 are attached to a top portion 64 of a clamshell type housing that also comprises a mating bottom portion 65. In this type of assembly, other components 66, 67 on the board 60 are inaccessible for repair or replacement until the components 61, 62, 63 are desoldered so that the housing 64 may be lifted away from the board 60. The bottom portion 65 is removed and is not involved in the desoldering process. Typically the bottom portion 65 is removably held to the top portion 64 via screws, clamps, or other fastening means as will be appreciated by those of skill in the art.

Figure 1:
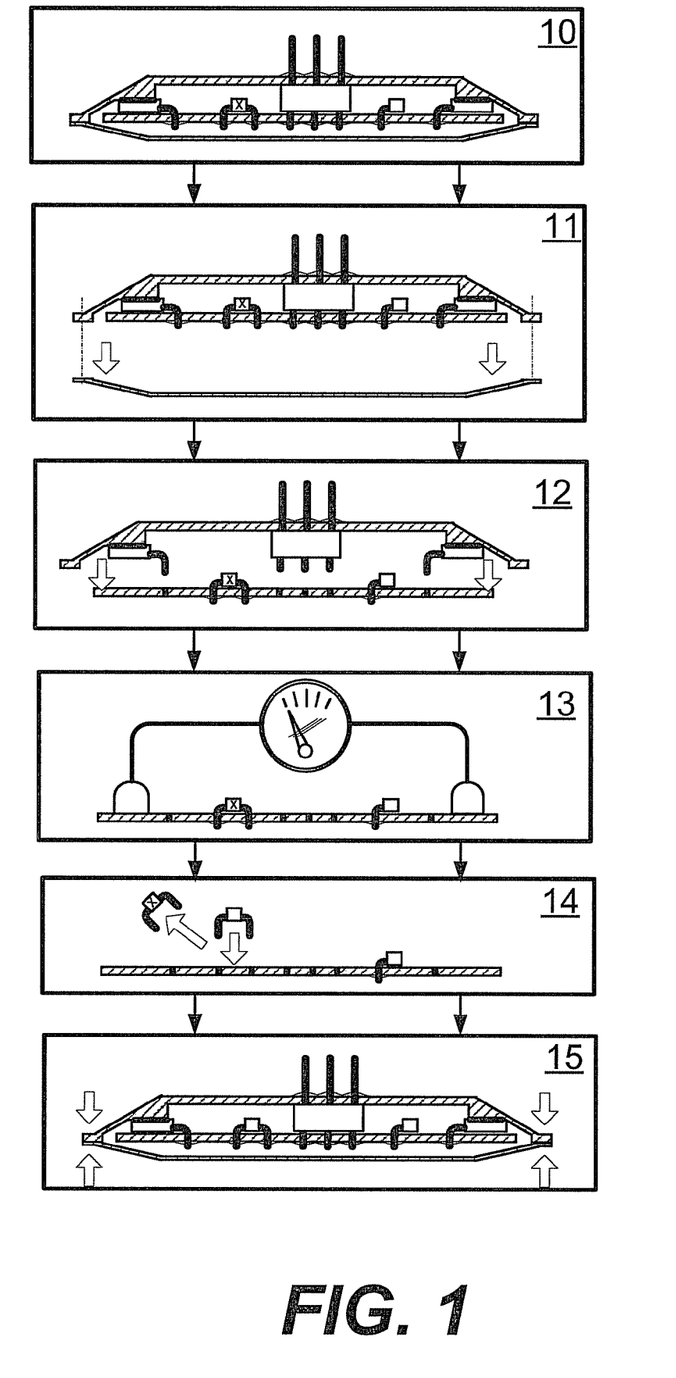
FIG. 1 is a schematic overview of a remanufacturing process for an electronic assembly with circuit boards having one or more components affixed to a housing of the assembly.

FIG. 1 is a schematic overview of a remanufacturing process for electronic assemblies. At stage 10, an electronic assembly such as an engine control unit (ECU) is provided for remanufacturing. For example, defective or outdated assemblies can be provided to a remanufacturing facility by a service facility. At stage 11, the electronic assembly housing is opened. In the illustrated example, the electronic assembly comprises a clam shell housing such as is illustrated in FIG. 6 that is opened to access the circuit components of the assembly. In the case of an assembly wherein certain components are affixed to an upper portion of the clam shell housing, desoldering of these components from the board at stage 12 allows the board to be separated from the upper portion of the clam shell housing, so that the other components on the board are no longer hidden by the upper portion of the clam shell housing and may be examined.

At stage 13 the board is tested to identify a defective component, which may then be replaced at stage 14. Finally, the disassembled electronic assembly is reassembled at stage 15 to form a remanufactured electronic assembly. The unit is optionally tested again after reassembly to ensure proper operation before the unit is sold or otherwise placed back into service.

As noted above, in the case of an assembly wherein certain component are affixed to the housing or other structure, it may be preferable to gain access to the board by desoldering these components from the board rather than separating the bond between the components and the housing. However, the process of desoldering involves the application of a significant amount of heat energy and, if performed without due care, may also involve the imposition of mechanical stresses on the component being removed and/or other nearby components.

To allow accurate and minimally damaging desoldering, a customizable desoldering fixture is provided in an embodiment. The desoldering fixture comprises a number of components including primarily a number of specifically configured solder pots as well as a solder source for supplying melted solder to the solder pots. The solder source may comprise a single reservoir in fluid communication with each solder pot, or alternatively a greater number of sources may be used. For example, it is contemplated that the desoldering fixture may include a separate solder source for each solder pot, and that the solder pots may themselves act as solder sources in an alternative embodiment. The solder pots, collectively referred to as a solder pot assembly, are filled with molten solder to a level such that the meniscus of the solder in each pot is at or rises slightly above the edge of the pot.

As will be discussed in greater detail, the circuit board comprises a base board formed from a nonconductive material such as glass, phenolic, fiberglass, plastic, fiber reinforced plastic (FRP), etc. For interconnecting various components mounted on the base board, the base board typically comprises a number of metallic paths or "traces" adhered to one or both sides of the base board. The circuit board further comprises electrical components mounted on a first surface, sometimes referred to as the "top" surface of the base board. Such electrical components can include resistors, transistors, capacitors, inductors, switches, relays, connector blocks, integrated circuits, and any other electrical components whether discrete or integrated, active or passive as needed to fulfill the requirements for the operation of the circuit board.

Typically, one or more of the electrical components on the board comprise wires or leads that extend through the base board to extend from the opposite side of the base board, sometimes referred to as the "bottom" surface of the base board, at solder joints. Typically the solder joints provide both mechanical linkage and electrical conduction between the relevant component and one or more traces on the base board.

Figure 2:
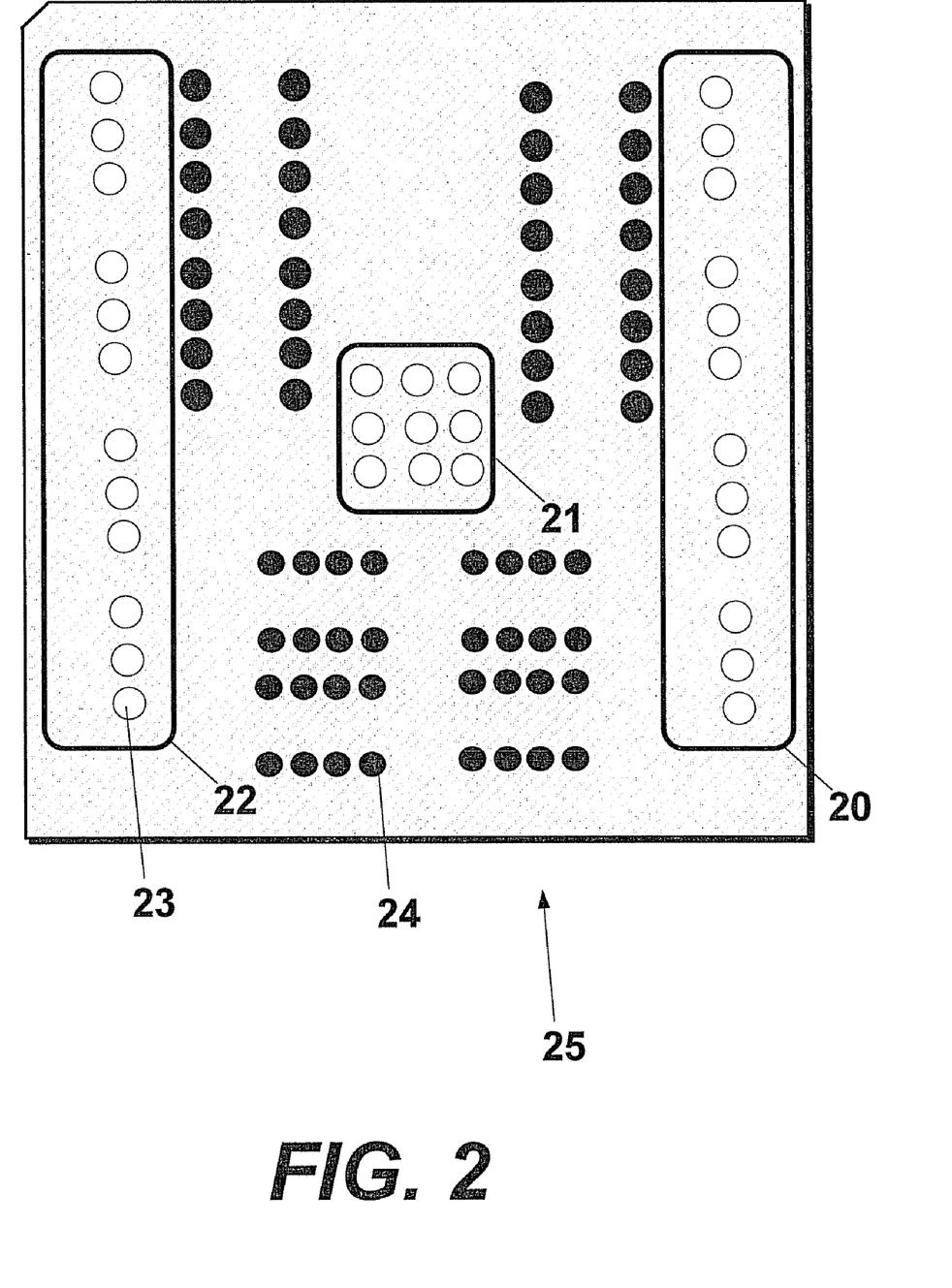
FIG. 2 is a plan view of a circuit board, showing the registration between the desoldering fixture in accordance with the disclosure and joints between selected components and the circuit board.
Figure 3:
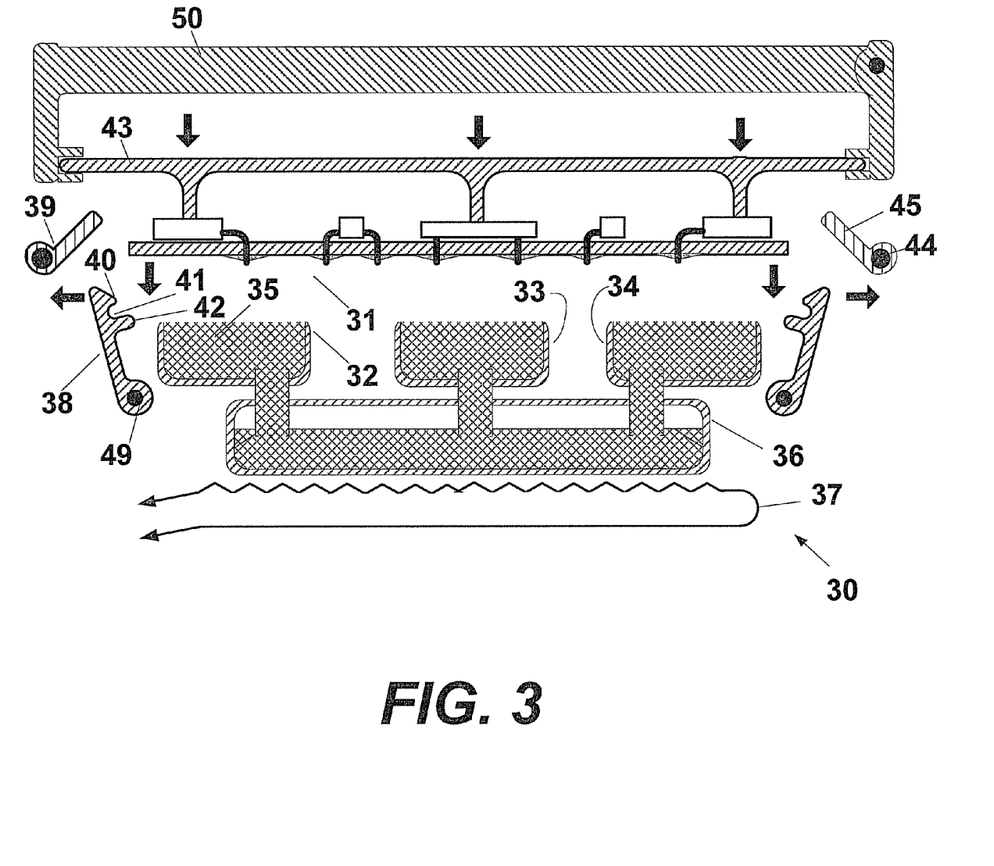
FIG. 3 is a cross-sectional side view of a desoldering fixture in accordance with the disclosure and a mating circuit board, wherein the circuit board is not yet inserted into the fixture.
Figure 4:
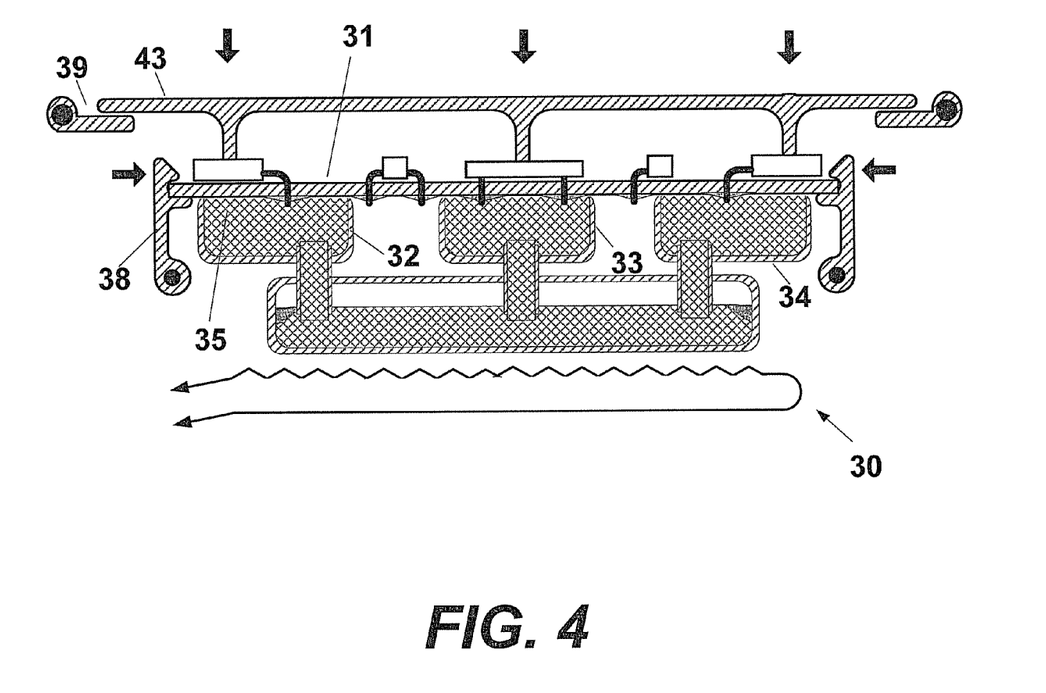
FIG. 4 is a cross-sectional side view of a desoldering fixture in accordance with the disclosure and a mating circuit board, wherein the circuit board is fully inserted into the fixture.
Figure 5:
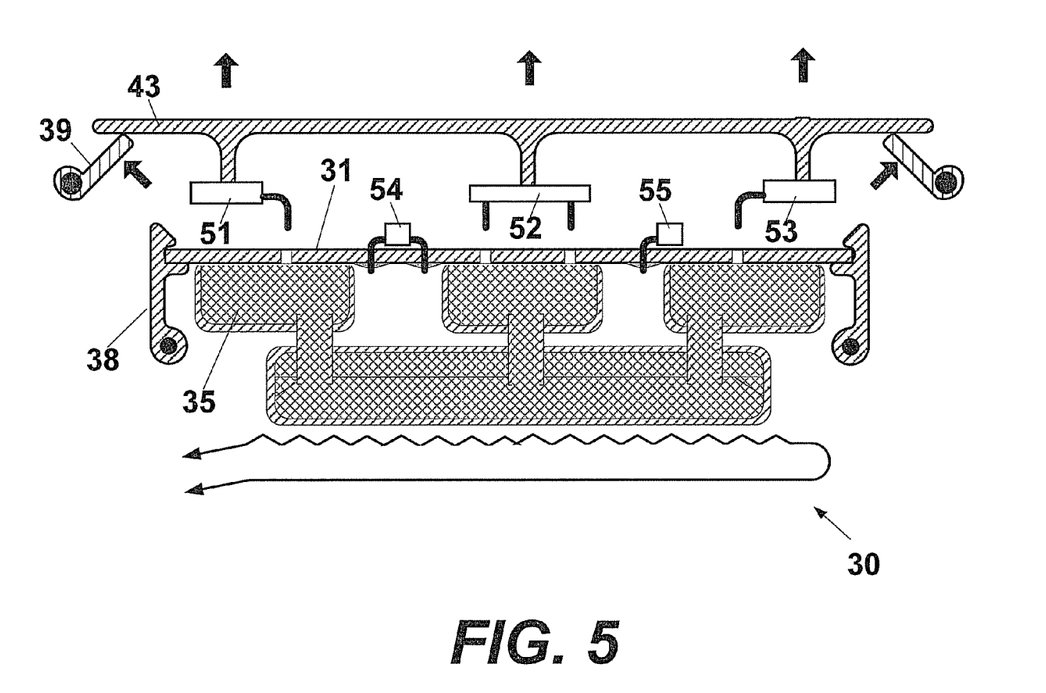
FIG. 5 is a cross-sectional side view of a desoldering fixture in accordance with the disclosure and a mating circuit board, wherein selected components have been desoldered from the circuit board and the remainder of the board has been ejected from the fixture.

An example of the desoldering fixture for use in accordance with the principles disclosed herein is shown in overview in the cross-sectional illustrations of FIGS. 3-5. Also shown in FIG. 2, in plan view, is a mating circuit board 25 for use with the desoldering fixture of FIGS. 3-5. In overview, solder pots 32, 33, 34 are shaped and located so that the respective solder pools held by the pots 32, 33, 34 are registered with the solder joints 23 of the components for which desoldering is desired.

This aspect of the illustrated example is more clearly shown in the plan view of FIG. 2. The solder pots each have a closed upper edge, and all of the upper edges lie essentially in a common plane. The edges collectively encompass a plurality of distinct regions. As can be seen, the respective top view outlines 20, 21, 22 of the solder pots 32, 33, 34 respectively encompass certain joints 23 (shown as hollow circles), but exclude other joints 24 (shown as solid circles). In this manner, when the soldered surface 11 of the board 31 is lowered onto the tops of the solder pots 32, 33, 34, only the encompassed joints 23 will be desoldered, allowing removal of the selected components without damaging or disturbing other components on the circuit board 31.

Thus, making a desoldering fixture for a given electronic assembly for use as described above comprises first identifying the joints on the board surface to be desoldered and then identifying the distinct regions that together would encompass all of the identified joints. At this point, the solder pot assembly is formed from a plurality of solder pots 32, 33, 34, each of whose upper edge is sized and shaped to encompass one of the distinct regions. Finally, the solder pots 32, 33, 34 are optionally fixed to a common base for stability, such that the upper edges of the solder pots 32, 33, 34 lie in a common plane. As will be discussed in greater details below, latches and lifters may also be added to the fixture to assist in the removal of desoldered components.

The operation and configuration of the disclosed desoldering system will now be more fully appreciated by continued reference to FIGS. 3-5. FIG. 3 shows an exemplary desoldering fixture 30 in accordance with the disclosure and a mating circuit board 31 in cross-sectional side view, wherein the circuit board 31 is above the fixture 30 and has not yet been inserted therein.

In the illustrated example, the desoldering fixture 30 comprises solder pots 32, 33, 34 located and configured as described above to mate to specific areas of the circuit board 31. The pots 32, 33, 34 are filled with molten solder 35 which is supplied by one or more solder sources 36. The solder source may comprise a pump (not shown) and preferably also comprises one or more heat sources 37 attached to the solder source 36 or integrated therein. The heat source 37 may be electric, e.g., a resistive element, or may comprise one or more fuel based heat sources, such as one or more gas burners. The fixture 30 optionally also comprises a fixture arm 50 for holding the circuit 31 and manipulating it with respect to the solder pots. For clarity, the fixture arm 50 will be omitted from the remaining drawings, but its position at each stage, when used, will be directly appreciated from the position of the circuit board 31.

During operation, the solder source 36 supplies molten solder 35 to the pots 32, 33, 34 so as to maintain an appropriate level of solder 35 therein. In the illustrated example, the solder 35 is maintained at a level that is even with the top of the pots 32, 33, 34. In practice, the solder 35 will form a meniscus in each pot, such that the highest level of the solder 35 may be above the top edge of the pot. As solder joints are melted, a small amount of solder is added to each pot, however this additional amount of solder is a very small percentage of the pot volume and may typically be ignored. Alternatively, a run-off path is provided for solder overflow from the pots, or the level of solder in the pots may be adjusted to account for the additional solder.

The fixture 30 also comprises, in the illustrated example, one or more latches 38 for restraining the circuit board 31 once it is brought into contact with the fixture 30. The latches 38 pivot about a pin 49, and may be spring loaded or otherwise actuated such that when the circuit board 31 is brought into contact with the fixture 30, the latches 38 grip and restrain the board 31. In the illustrated example, each latch 38 comprises a ramped introduction portion 40 that causes the latch to open and admit the circuit board 31. As the board 31 is further inserted, an indention 41 catches the edge of the board 31 and retains it. A ledge 42 prevents further downward motion of the board 31. Other types of latches may be used to suit a particular application as will be understood by those of ordinary skill in the art.

In addition, one or more lifters 39 are optionally provided on the fixture 30 to lift a bracket or housing 43 attached to the removable circuit components once the components 50, 51, 52 have been desoldered. Each lifter 39 comprises a pivot 44 and a lifting arm 45. The lifters 39 may be spring loaded or biased to push the housing 43 away from the fixture, so that as the solder holding the components is softened, the housing automatically moves away from the board 31 to cause disassembly thereof. Alternatively, the lifters 39 may be controlled manually or automatically to lift the housing 43 at a desired time or temperature, or after a desired duration of contact with the fixture 30. In the illustrated embodiment, the lifters 39 are situated adjacent the latches 38 so as to manipulate the same edges of the circuit board or housing 43. Alternatively, the latches 38 may be situated along two mutually opposite edges of a circuit assembly while the lifters 39 are situated along the remaining two mutually opposite edges. In another alternative embodiment, the lifters may be situated so that there is a lifter associated with each edge of the board or assembly, and the latches may be associated with all or a subset of the edges. Other types of lifters may be used to suit a particular application as will be understood by those of ordinary skill in the art.

The bracket or housing 43 may be a part of the circuit board assembly, e.g., the housing 64 shown in FIG. 6. Alternatively, the housing or bracket 43 shown in FIG. 3 may be a part used solely for the desoldering process. In this embodiment, the bracket 43 is formed so as to mate with the components to be removed, and may be fixed to the components via clamps, latches, suction devices, adhesives, etc., as will be appreciated by those of skill in the art.

The cross-sectional side view of FIG. 4 illustrates the board 31 inserted into the fixture 30 so that the bottom of the board 31 contacts the tops of the solder pots 32, 33, 34 and the joints of the components to be removed are immersed in the solder 35. In this position, the latches 38 hold the board against the solder pots 32, 33, 34 while the solder 35 softens the immersed joints. The lifters 39 are compressed in this position by the board 31, but cannot rebound until the solder of the components attached to the bracket 43 has been sufficiently softened to allow removal of the components.

Once the solder joints have been melted by the molten solder 35, the related components 51, 52, 53 are free to move. At this point, the lifters 39 are able to rotate and lift the bracket 43 and attached components 51, 52, 53 away from the board 31 as shown in FIG. 5. The latches 38 retain the board 31 during this movement. The board 31 may be subsequently detached from the fixture 30 by manual or automatic opening of the latches 38. The other components 54, 55 on the board 31 and their solder joints are advantageously not affected by the removal of the components 51, 52, 53. In particular, the joints of the other components 54, 55 are not exposed to molten solder, and thus remain solid.

Figure 7:
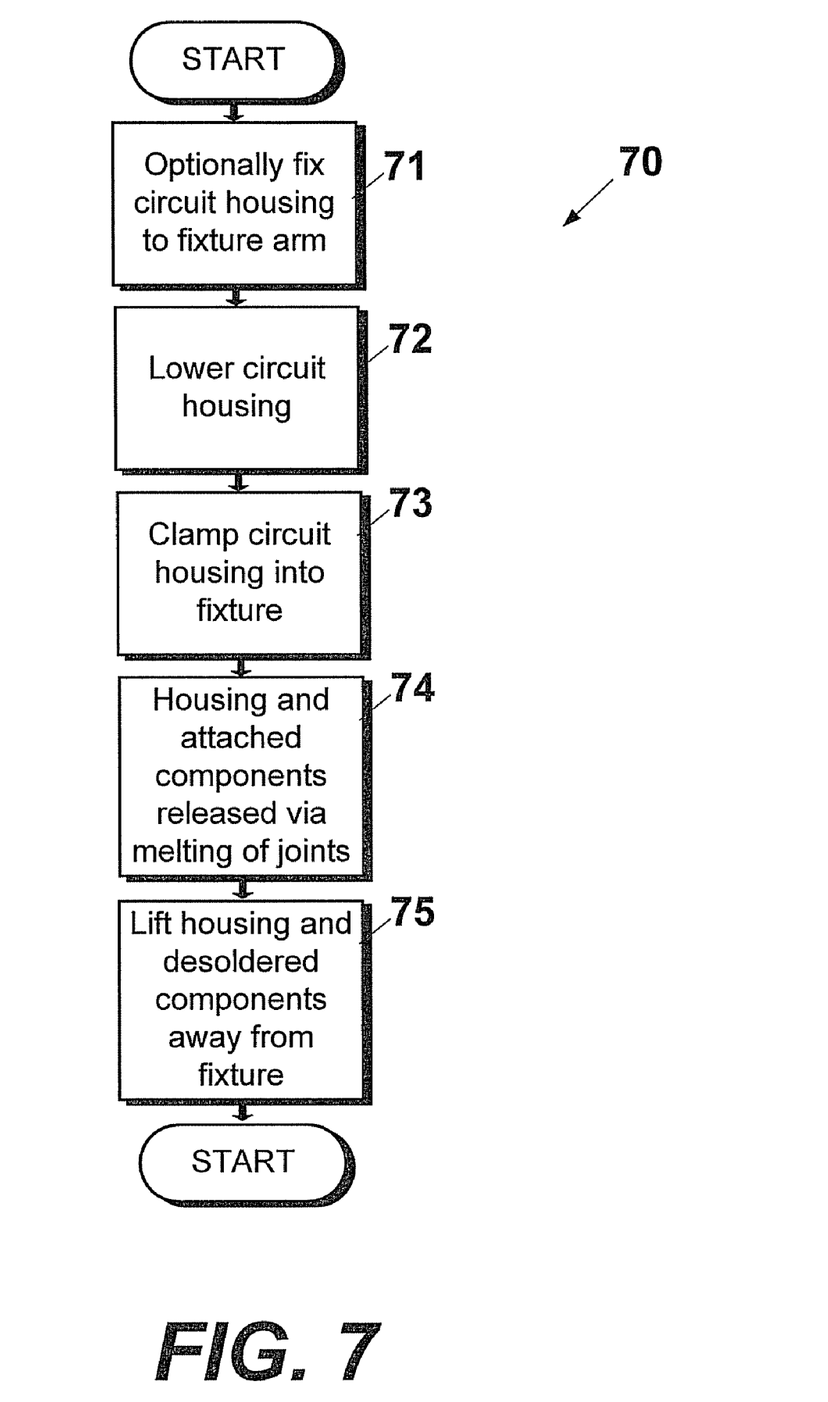
FIG. 7 is a flow chart illustrating a process of desoldering selected components via a fixture in accordance with the disclosure.

An exemplary desoldering process using the fixture of the present disclosure is illustrated in the flow chart 70 of FIG. 7. Prior to executing the illustrated process 70, selected components are identified for removal, i.e., by forming a fixture for attachment to the selected components, or by the manufacture of an assembly in which certain components are glued or otherwise fixed to a structure such as a housing portion. In addition, a solder pot assembly is created mapping pools of solder to soldered joints of the selected components, as in FIG. 2, and is placed in a fixture such as that illustrated in FIGS. 3-5. Although the foregoing illustrations show three solder pots, there may be a greater or lesser number of pots depending upon the number and location of components selected for removal.

At stage 71 the circuit housing or bracket is optionally fixed to a fixture arm such as arm 50 illustrated in FIG. 3. The circuit housing is lowered via the fixture arm 50 toward the desoldering fixture in stage 72 and is clamped into place on the fixture, e.g., by latches 38, in stage 73. It will be appreciated that the housing may alternatively be manually lowered and latched into the fixture. At stage 74, the solder in the solder pots melts the joints of interest, releasing the housing and attached components for removal. Lifters, such as lifters 39, optionally associated with the desoldering fixture lift the housing and desoldered components away from the fixture in stage 75.

INDUSTRIAL APPLICABILITY

The present disclosure is applicable to the remanufacture or disassembly of electronic assemblies comprising circuit boards with soldered connections thereon. The system and fixtures described herein are advantageously capable of producing a remanufactured circuit assembly with minimal waste of salvageable components. In part, this is accomplished via the selective removal of soldered components from the larger assembly without damaging surrounding components or their solder joints. The fixture disclosed herein further advantageously replaces the time-consuming and essentially non-scalable practice of desoldering such joints on an individual basis.

In the disclosed example, a circuit assembly such as an ECU is received for remanufacture and the housing of the assembly is opened by removing a first portion to allow access to the underside of an enclosed printed circuit board. Certain of the board's components are also affixed to the inside surface of a second portion of the housing, and as such the board and housing are not readily separable. Any such components are desoldered from the board via a specialized fixture to allow the board to be removed, tested, and repaired as appropriate.

Although the foregoing examples focus primarily on circuit assemblies wherein certain circuit components are affixed to an assembly housing, it will be appreciated that the disclosed principles are more broadly applicable and that certain aspects such as the specialized desoldering fixture of FIGS. 3-5 apply to any circuit for which localized desoldering is appropriate. For example, when routinely removing soldered components from a large number of similar assemblies, the described desoldering fixture beneficially allows for cost-effective, efficient, precise, repeated desoldering operations.

Moreover, the use of the disclosed fixture to desolder one or more components allows the removed components to be easily reinserted and resoldered when appropriate. This is because the process does not disturb the connection or alignment of the components on the upper portion of the housing.

It will be appreciated that the foregoing description provides examples of the disclosed system and technique. However, it is contemplated that other implementations of the disclosure may differ in detail from the foregoing examples. All references to the disclosure or examples thereof are intended to reference the particular example being discussed at that point and are not intended to imply any limitation as to the scope of the disclosure more generally. All language of distinction and disparagement with respect to certain features is intended to indicate a lack of preference for those features, but not to exclude such from the scope of the disclosure entirely unless otherwise indicated. All methods described herein can be performed in any suitable order unless otherwise indicated herein or otherwise clearly contradicted by context.

Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

We claim:

1. A method for remanufacturing an electronic assembly, the assembly including a housing having therein a circuit assembly comprising a plurality of components, at least one of which is affixed to a portion of the housing, the method comprising:

removing a first portion of the housing to expose a portion of the circuit assembly, the exposed portion of the circuit assembly having thereon a plurality of solder joints, one or more of the solder joints being associated with at least one component affixed to a second portion of the housing for linking the at least one component to the circuit assembly;

lowering the exposed portion of the circuit assembly onto a desoldering fixture, wherein the desoldering fixture comprises a solder pot assembly including a plurality of solder pots each containing solder and having a closed upper edge, the upper edges of the pots lying essentially in a common plane and collectively encompassing a plurality of distinct regions, the solder pot assembly being registered with the exposed portion of the circuit assembly such that each solder joint associated with the at least one component affixed to the portion of the housing is aligned with only one of the plurality of distinct regions, and each solder joint not associated with the at least one component is registered with an area outside of the plurality of distinct regions; and lifting the second portion of the housing away from the solder pot assembly while restraining the circuit assembly, thereby removing from the circuit assembly the at least one component affixed to the second portion of the housing.

2. The method according to claim 1, further comprising testing the circuit assembly to identify an improperly operating component thereon.

3. The method according to claim 2, further comprising reconditioning the circuit assembly by performing an operation selected from the group consisting of replacing the improperly operating component, repairing the improperly operating component, and adjusting the improperly operating component.

4. The method according to claim 3, further comprising reassembling the electronic assembly.

5. The method according to claim 1, wherein lowering the exposed portion of the circuit assembly onto the desoldering fixture comprises engaging one or more latches to hold the circuit assembly in place against the upper edges of the plurality of solder pots.

6. The method according to claim 5, wherein the one or more latches comprise two latches located to restrain respective opposite first and second edges of the circuit assembly.

7. The method according to claim 1, wherein lowering the exposed portion of the circuit assembly onto a desoldering fixture comprises melting the one or more solder joints associated with the component affixed to the second portion of the housing.

8. The method according to claim 7, wherein lifting the second portion of the housing away from the solder pot assembly comprises engaging a lifter assembly after the one or more solder joints associated with the component affixed to the second portion of the housing are melted.

9. A method of using and processing an engine control unit having a housing and a circuit assembly therein comprising a plurality of components, at least one of which is affixed to a portion of the housing, the method comprising:
   installing the engine control unit into a machine unit;
   using the engine control unit to control an engine of the machine unit;
   removing the engine control unit from the machine unit;
   removing a first portion of the housing to expose a portion of the circuit assembly, the exposed portion of the circuit assembly having thereon a plurality of solder joints, one or more of the solder joints being associated with at least one component affixed to a second portion of the housing for linking the at least one component to the circuit assembly;
   lowering the exposed portion of the circuit assembly onto a desoldering fixture, wherein the desoldering fixture comprises a solder pot assembly including a plurality of solder pots each containing solder and having a closed upper edge, the upper edges of the pots lying essentially in a common plane and collectively encompassing a plurality of distinct regions, the solder pot assembly being registered with the exposed portion of the circuit assembly such that each solder joint associated with the at least one component affixed to the portion of the housing is aligned with only one of the plurality of distinct regions, and each solder joint not associated with the at least one component is registered with an area outside of the plurality of distinct regions;
   lifting the second portion of the housing away from the solder pot assembly while restraining the circuit assembly, thereby removing from the circuit assembly the at least one component affixed to the second portion of the housing; and
   testing the circuit assembly as if the at least one component had not been removed.

10. The method according to claim 9, further comprising repairing the circuit assembly.

11. The method according to claim 10, further comprising reassembling the circuit assembly and the first and second portions of the housing to form a remanufactured engine control unit and installing the remanufactured engine control unit into a machine unit.

* * * * *